(12) United States Patent
Atti et al.

(10) Patent No.: US 7,773,450 B2
(45) Date of Patent: Aug. 10, 2010

(54) INTEGRATED CIRCUIT HAVING A WORD LINE DRIVER

(75) Inventors: Massimo Atti, Montegrotto Terme (IT); Michele Boraretto, Adria (IT); Christoph Deml, Munich (DE); Maciej Jankowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 474 days.

(21) Appl. No.: 11/674,917

(22) Filed: Feb. 14, 2007

(65) Prior Publication Data

US 2007/0211531 A1 Sep. 13, 2007

(30) Foreign Application Priority Data

Feb. 15, 2006 (DE) .................. 10 2006 007 023

(51) Int. Cl.
*G11C 6/00* (2006.01)

(52) U.S. Cl. .................. 365/230.05; 365/189.05; 365/189.11; 365/189.12

(58) Field of Classification Search ............ 365/230.06, 365/189.05, 189.11, 230.03, 189.12
See application file for complete search history.

(56) References Cited

U.S. PATENT DOCUMENTS

| | | | |
|---|---|---|---|
| 5,270,980 A | 12/1993 | Pathak et al. | |
| 5,911,153 A * | 6/1999 | Dhong et al. | ............... 711/218 |
| 6,058,060 A * | 5/2000 | Wong | .......................... 365/218 |
| 6,535,430 B2 * | 3/2003 | Ogura et al. | ........... 365/185.23 |
| 2007/0030741 A1 * | 2/2007 | Nii et al. | ................. 365/189.11 |

* cited by examiner

*Primary Examiner*—Son Dinh
(74) *Attorney, Agent, or Firm*—Dicke, Billig & Czaja, PLLC (57) ABSTRACT

An integrated circuit having a plurality of sectors is disclosed. One embodiment includes a sector driver for simultaneously driving word lines corresponding to a single sector, the sector driver being connected to each word line and comprising a programmable sector memory for storing the sectors and word lines corresponding to each sector.

16 Claims, 3 Drawing Sheets

INTEGRATED CIRCUIT HAVING A WORD LINE DRIVER

CROSS-REFERENCE TO RELATED APPLICATIONS

This Utility Patent Application claims priority to German Patent Application No. DE 10 2006 007 023.2 filed on Feb. 15, 2006, which is incorporated herein by reference.

BACKGROUND

The present invention is directed to an integrated circuit. One embodiment includes a semiconductor memory device having a plurality of memory cells.

A conventional flash memory is formed by a matrix of flash transistors. The matrix includes rows and columns of flash transistors. These transistors are also called EEPROM transistors, which is an abbreviation for the term electronically erasable programmable read-only memory. The flash memory is a non-volatile memory. This means that stored information is maintained, even if the energy supply to the memory cells is turned off. The memory content may be programmed using electrical pulses.

The flash transistors are field effect transistors (FET), which include a floating gate. The floating gate consists of a conductor surrounded by insulators. Therefore, the charge carriers deposited on the floating gate my not dissipate. The conductor is positioned above the source-drain-channel of the flash transistor. The memory cell is programmed by applying charges to the floating gate or by discharging the floating gate. Due to the charge deposited on the floating gate, a voltage is provided, which increases or decreases the channel between the source and drain of the transistor. Consequently, the voltage of the floating gate influences the conductivity of the source-gate-channel.

The plurality of sectors defined on the flash memory is called the sectorization of the memory cell. The size of a sector defines the speed of erasing and programming of the memory cells. In general, the size of the sectors is adapted to the user's needs of both small and big sectors depending on the target application of the flash memory. In order to have different sector sizes the flash memory must be completely redesigned. Therefore, additional costs are conferred onto the flash memory.

For these and other reasons, there is a need for the present invention.

SUMMARY

One embodiment provides an integrated circuit having a plurality of sectors and a word line decoder. The integrated circuit includes a sector driver for simultaneously driving word lines corresponding to a single sector, the sector driver being connected to each word line and comprising a programmable sector memory for storing the sectors and word lines corresponding to each sector.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention is directed to an integrated circuit, in one embodiment including a semiconductor memory device having a plurality of memory cells. Each memory cell includes a control gate, a source and a drain. The memory cells are arranged rows and columns. A single word line is connected to the control gates of the memory cells in one row. The memory cells are grouped into plurality of sectors, each sector having a plurality of the flash memory cells. A word line decoder is adapted to decode a row address of a particular memory cell and drive the corresponding word line connected to the addressed memory cell.

One embodiment provides a new semiconductor device, e.g., flash memory, in particular, a flash memory which may be flexibly adapted to the user's needs and avoids the expenses of different designs.

According to an embodiment, a semiconductor device includes a plurality of memory cells, the memory cells being arranged in rows and columns. The device includes a plurality of word lines, each of the word lines being associated with the memory cells arranged in one of the rows. A device is provided for simultaneously driving a freely selectable combination of the word lines.

According to a further embodiment, a semiconductor memory device includes a plurality of memory cells. Each memory cell includes a control gate, a source and a drain. The memory cells are arranged rows and columns. A plurality of word lines is connected to the control gates of the memory cells in one row. The memory cells are grouped into a plurality of sectors, each sector having a plurality of the flash memory cells. A word line decoder is adapted to decode a row address of a particular memory cell and drive the corresponding word line connected to the addressed memory cell. The semiconductor memory device includes a sector driver for driving the word lines of each sector. The sector driver is connected to each word line and includes a programmable sector memory for storing the word lines of each sector. The sectors of the memory device may simply be adapted by programming the sector driver. This permits to adapt the memory device in order to fit the needs of different customers without having to redesign the memory device. It may be used for a wide range of customers.

Furthermore, the memory device according to embodiments of the present invention may be used for testing the word line decoder. This is accomplished by inputting a row address into the word line decoder and reading out a bit line using a sense amplifier, the bit line being connected to the addressed row of memory cells. Thereafter, the row of memory cells is driven using the sector driver and the bit line is read out using the sense amplifier. Finally, the result of reading out the bit line being driven by the sector driver is compared to the result of reading out the bit line being driven by the word line decoder. If the results differ then either the word line decoder of the sector driver are malfunctioning. In case the read out fails irrespective of whether the sector driver of the word line decoder are being used, then the failure probably exists in the following level shifter for transforming the low logical voltage to the high programming voltage.

In one embodiment, the memory cells of the memory device are EEPROM transistors. The sector driver includes a plurality of memory cells such as latches. The memory cells have a data input and a data output, the data output of each latch being connected to one word line. The latches may be used for driving the word lines of a particular sector. Therefore, the input of each latch connected to a word line of the chosen sector is driven with a high input, whereas the residual latches receive a low data input. Then the data input of the latches is shifted to the data output of the latches.

The semiconductor memory device according to one embodiment includes a plurality of or-gates having an output and two inputs, the output of each or-gate being connected to a word line, the inputs of each or-gate being connected to one latch and the word line decoder. Both the word line decoder and the sector driver may optionally control the word lines of the memory device via the respective or-gates.

The plurality of latches constitutes a shift register. A shift register may be implemented by connecting the data output of each latch to the data input of each consecutive latch. Each latch has a control input for shifting the data input to the data output. In order to control a particular number of word lines of a sector, a high input is shifted consecutively to the respective latches. Furthermore, the shift register may be used for addressing a single word line. Consequently, a read operation may be performed using the shift register or a standard word line decoder. However, plural clock cycles are needed for shifting a logical high level to a particular latch of the shift register. Therefore, a standard word line decoder may drive a particular word line faster than the shift register. In case the speed requirements are modest, the shift register may be used instead of the standard word line decoder. In this case, the word line decoder includes a device for decoding a memory address into a bit sequence. The bit sequence includes a single high bit representing the addressed word line. Then, the bit sequence is entered into the shift register. Finally, the latches of the shift register are used for driving the word line.

Each latch of the shift register includes a reset input for resetting the data output of each latch. Thereby, all of the latches may be reset within a single clock cycle. The speed of operation is increased in case the sector driver drives plural sectors consecutively.

A semiconductor memory device according to one embodiment includes a plurality of level shifters for shifting an input voltage to a higher output voltage, wherein a level shifter is provided for each word line. The logical high level used for addressing the word lines is usually not sufficient for driving the word line. Therefore, the level shifter provides the appropriate voltage for erasing and programming of the memory cells.

The semiconductor memory device according to one or more embodiments of the present invention includes a plurality of high voltage switches, each high voltage switch connecting one of the level shifters to the output of one of the or-gates. The high voltage switches are used for protecting the word line decoder and sector driver against the high voltages used for programming and erasing the memory cells. A level shifter may be implemented by connecting two particular inverters in series to each other. The magnitude of the voltage may be increased each time the input signal is inverted. The voltage sign is not changed, since the inverters reverse the voltage sign twice.

The word lines of each sector of the semiconductor device according to embodiments of the present invention are defined by reading a dedicated configuration bit string stored in the programmable sector and loaded in the plurality of latches.

The sectors of the semiconductor memory device are programmed by determining the word lines associated with each sector or the memory device, and storing the sectors and corresponding word lines in the programmable sector memory.

Figure 1:
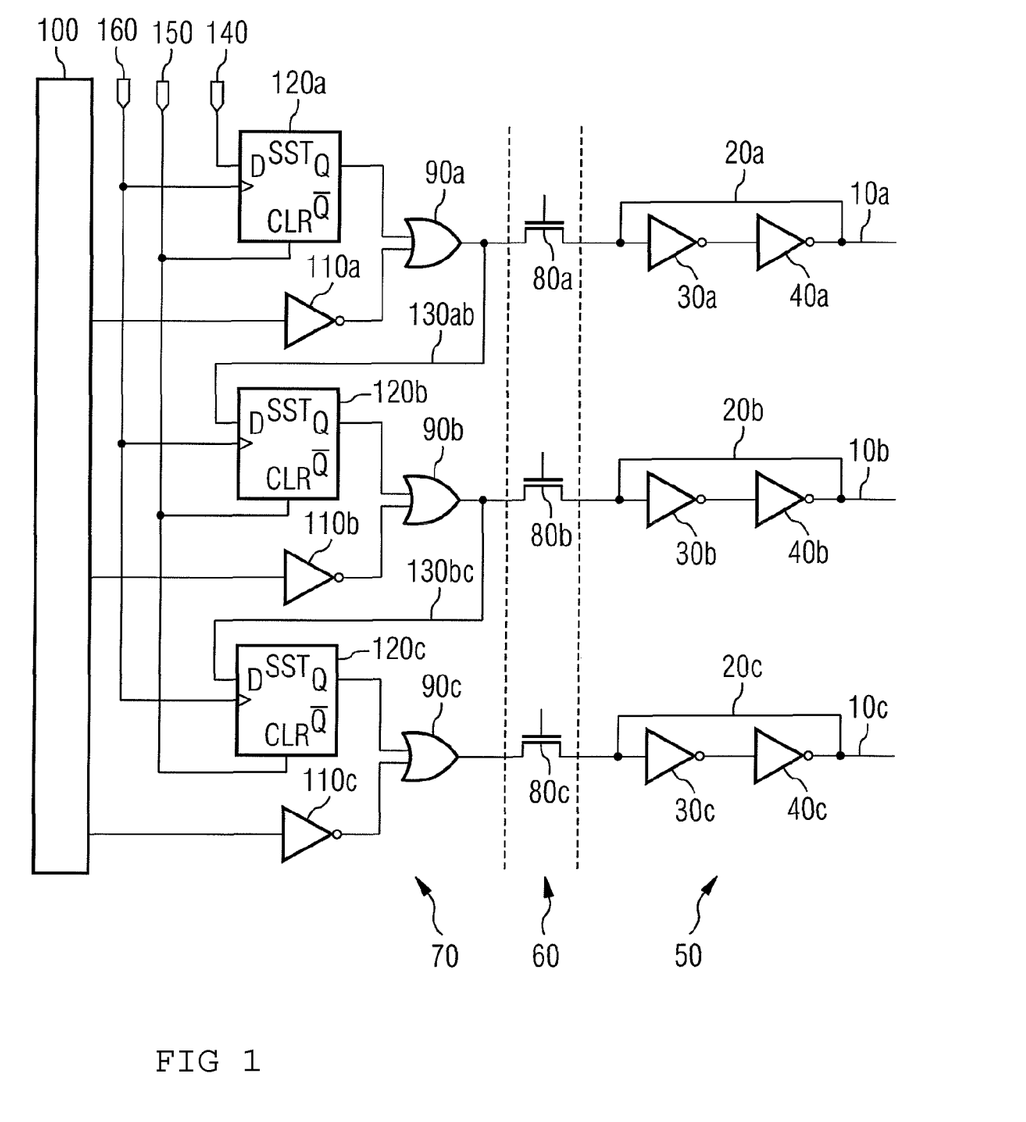
FIG. 1 illustrates a schematic diagram of a portion of a semiconductor memory device according to one embodiment of the present invention.

Reference signs 10a, 10b and 10c in FIG. 1 illustrate a first second and third word line of a Flash memory having a plurality of EEPROM transistor cells (not illustrated) arranged in rows and columns. The control gate of each EEPROM transistor cell is connected to one word line. EEPROM transistor cells in one row are connected to a single word line. The drains of the transistor cells are connected to bit lines. The bit lines are used for detecting the state of the floating gate of the EEPROM transistors.

The circuit illustrated in FIG. 1 includes three different parts, namely a high voltage part 50, a low voltage part 70 and a connecting part 60, which connects the high voltage 50 to the low voltage part 70. Level shifters 20a, 20b and 20c are connected to the first, second and third word line 10a, 10b and 10c. The level shifter is adapted to transform the voltage from the low voltage part into a high voltage. The term high voltage is defined in this context to mean a voltage sufficient for programming the memory cells of the semiconductor device. Low voltage refers to the voltage difference used for representing high and low states (logical 1 and 0) of a logical circuit.

Each level shifter 20a, 20b, 20c includes two inverters, namely a first inverter 30a, 30b, 30c and a second inverter 40a, 40b, 40c. The output of the second inverters is fed back to the input of the first inverter. The input of the inverter 30a, 30b, 30c and the output of the second inverter 30a, 30b, and 30c are controlled in such a way, that the output is equal to the input in balance. Therefore, the input of each level shifter may reach the high output voltage.

High voltage switches 80a, 80b and 80c connect the level shifters 20a, 20b and 20c to the low voltage part 70 of the circuit. The high voltage switches prevent the high voltage of the inverters from damaging the logical low voltage part 70 of the circuit.

Each word line 10a, 10b, and 10c is connected via the level shifters, 20a, 20b and 20c, the high voltage switches 80a, 80b and 80c, or-gates 90a, 90b and 90c, and inverters 110a, 110b and 110b to word line decoder 100. If a column address is input to the word line decoder, the word line decoder identifies the respective word line 10a, 10b or 10c. If for example word line 10*a* is determined, then a low voltage signal is output to the respective inverter 110*a*. The residual inverters 110*b* and 110*c* are driven with a high signal. Consequently, the output of inverter 110*a* is in a high state, whereas the output of residual inverters 110*b* and 110*c* is in a low state. The or-gates 90*a*, 90*b* and 90*c* forward the output voltages of the inverters 110*a*, 110*b* and 110*c* via switches 80*a*, 80*b* and 80*c*. Then the level shifter amplifies the logical high input signal to the output level. Since only the output of inverter 110*a* is in a high state, the voltage on word line 10*a* becomes high, whereas the voltage on word lines 10*b* and 10*c* remains low. In this way, each word line may be driven independently, e.g., in order to perform a read operation on the EEPROM transistor cells.

Additionally, the circuit of FIG. 1 includes plural latches 120*a*, 120*b* and 120*c*. The output Q of each latch 120*a*, 120*b*, 120*c* is connected to the respective word line 10*a*, 10*b* and 10*c* via the respective or gates 80*a*, 80*b*, 80*c*, respective high voltage switches 80*a*, 80*b* and 80*c* as well as the respective level shifters 20*a*, 20*b* and 20*c*. Plural word lines 10*a*, 10*b* and 10*c* may be driven simultaneously by the respective latches 120*a*, 120*b* and 100*c*, e.g., in order to perform an erase or programming (or e.g., a read) operation on the EEPROM transistor cells. For this purpose a data input D may be latched to a data output Q of each latch 120*a*, 120*b* and 120*c* using a shift input ">" of each latch 120*a*, 120*b* and 120*c*. All of the shift inputs are connected in parallel to a Shift clock input 160. The word lines 10*a*, 10*b* and 10*c* may be driven simultaneously, if the inputs D of the latches 120*a*, 120*b* and 120*c* are shifted to the outputs Q of the latches. Then, all of the high voltage switches 80*a*, 80*b* and 80*c* are closed. Consequently, the data output Q of each latch 120*a*, 120*b* and 120*c* is level shifted by the respective levels shifter 20*a*, 20*b* and 20*c* and transferred simultaneously onto the respective word lines 10*a*, 10*b* and 10*c*. In this instance, the word line decoder 100 is refrained from driving the word lines 10*a*, 10*b* and 10*c*. Therefore, the output of each inverter 110*a*, 110*b* and 110*c* is low, such that the output of the or-gates 90*a*, 90*b* and 90*c* corresponds to the output Q of each respective latch 120*a*, 120*b* and 120*c*.

In the embodiment according to FIG. 1, the latches 120*a*, 120*b* and 120*c* form a shift register. One (high or low) bit input to the data input D of shift register 120 is shifted from the input D of shift register 120*a* to the input D of shift register 120*b*, if the shift clock input 160 is utilized once. This is accomplished by line 130*ab* connecting the output Q of latch 120*a* to the data input D of latch 120*b*. If the shift clock input is utilized twice, then the date input D of shift register 120 is transferred to the data input D of latch 120*c* via line 130*bc*, which connects the data output Q of latch 120*b* to the data input Q of latch 120*c*. Any sequence of bits may be transferred to the inputs D and outputs of the latches 120*a*, 120*b* and 120*c* ad libitum.

Finally, each of the latches 120*a*, 120*b* and 120*c* includes an additional Reset input "CLR". All of the reset inputs are connected in parallel to the single reset input 150, which constitutes the reset input of the shift register. The input and output states of each latch 120*a*, 120*b* and 120*c* may be immediately returned to a low voltage state, in order to set the initial conditions of each latch back.

Figure 2:
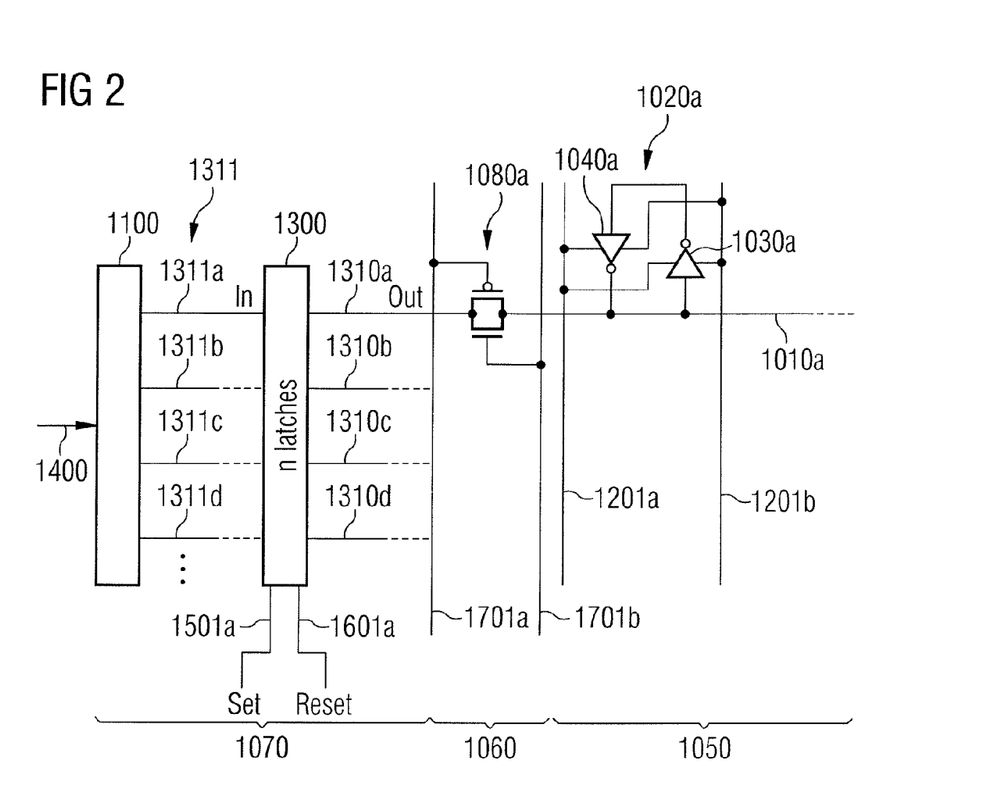
FIG. 2 illustrates a schematic diagram of a portion of a semiconductor memory device according to a further embodiment of the present invention.

FIG. 2 illustrates a schematic diagram of a portion of a semiconductor memory device according to a further embodiment of the present invention.

Reference sign 1010*a* in FIG. 2 illustrates one of a plurality of parallel word lines of a Flash memory having a plurality of EEPROM transistor cells (not illustrated) arranged in rows and columns. The control gate of each EEPROM transistor cell may e.g., be connected to one respective word line. EEPROM transistor cells in one row are connected to a single common word line. The drains of the transistor cells e.g., are connected to respective bit lines. The bit lines e.g., are used for detecting the state of the floating gate of the EEPROM transistors.

The circuit illustrated in FIG. 2 includes three different parts, namely a high voltage part 1050, a low voltage part 1070 and a connecting part 1060, which connects the high voltage part 1050 to the low voltage part 1070. High voltage supply devices/high voltage latches/level shifters 1020*a* are connected to the word lines 1010*a*. The voltage supply devices/high voltage latches 1020*a* e.g., are adapted to transform the voltage from the low voltage part 1070 into a high voltage, in particular, are adapted to provide the high voltage to a respective selected word line 1010*a*, and/or e.g., are adapted to latch selection of the respective word line 1010*a*. The term high voltage is defined in this context to mean a voltage sufficient for programming the memory cells of the semiconductor device.

Each high voltage supply device/high voltage latch 1020*a* includes two inverters, namely a first inverter 1030*a* and a second inverter 1040*a*. The output of the first inverter 1030*a* is fed to the input of the second inverter 1040*a*. Further, the output of the second inverter 1040*a* is fed back to the input of the first inverter 1030*a*. In addition, the input of the first inverter 1030*a* and the output of the second inverter 1040*a* are both connected to the word line 1010*a* associated with the respective high voltage supply device/high voltage latch 1020*a*. As is further illustrated in FIG. 2, both the first and the second inverter 1030*a*, 1040*a* may be connected to a respective pair of high voltage power supply lines 1201*a*, 1201*b*.

High voltage switches 1080*a* connect the high voltage supply devices/high voltage latches/level shifters 1020*a*, and the respective word lines 1010*a* to the low voltage part 1070 of the circuit. The high voltage switches 1080*a* prevent the high voltage of the high voltage part 1050 from damaging the low voltage part 1070 of the circuit.

In the embodiment illustrated in FIG. 2, the high voltage switches 1080*a* each include a respective transmission gate. As further illustrated in FIG. 2, each high voltage switch transmission gate includes a first and a second transistor, the source of the first respective transistor being connected to the drain of the second respective transistor, and the drain of the first respective transistor being connected to the source of the second respective transistor (or vice versa). Alternatively, similarly as illustrated in FIG. 1, each high voltage switch instead of a transmission gate e.g., may only include one single transistor.

The drain/source path of the first transistor of the high voltage switch transmission gate, and correspondingly similar the drain/source path of the second transistor of the high voltage switch transmission gate are connected between the associated word line 1010*a*, and a latch output line 1310*a* associated with the respective word line 1010*a*.

Each word line 1010*a* is connected via the associated voltage supply device/high voltage latch 1020*a*, the associated high voltage switch 1080*a*, and the associated latch output line 1310*a* to an output (OUT) of a respective associated latch 1300*a* (see FIG. 3) of a plurality of latches 1300 (here: n latches) associated with a respective word line decoder 11100.

Figure 3:
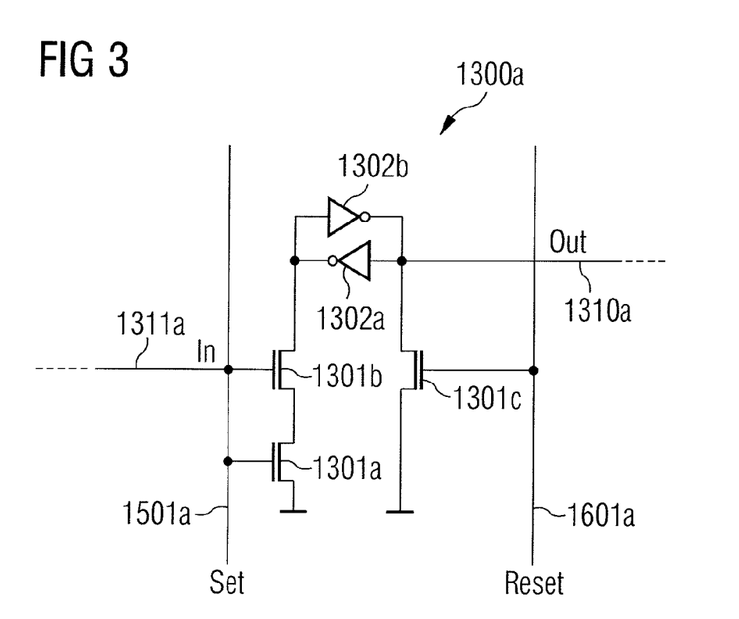
FIG. 3 illustrates a detailed circuit diagram of one of the latches used in the semiconductor memory device of FIG. 2.

As is further illustrated in FIGS. 2 and 3, an input (IN) of a respective latch 1300*a* is connected via an associated (latch input) line 1311*a* (i.e., a latch input line 1311*a* associated with a respective word line 1010*a*) of a plurality of latch input lines 1311 (here: n latch input lines 1311) to the word line decoder 1100.

As is additionally illustrated in FIG. 3, each latch 1300*a* of the n latches 1300 e.g., includes a first, a second, and a third transistor 1301*a*, 1301*b*, 1301*c*, and a first and a second inverter 1302*a*, 1302*b*.

The gate of the second transistor 1301*b* is connected to the associated latch input line 1311*a*. Further, the drain/source path of the second transistor 1301*b* is connected between the drain/source path of the first transistor 1301*a*, and the output of the first inverter 1302*a*/the input of the second inverter 1302*b*.

Further, the output of the second inverter 1302*b* and the input of the first inverter 1302*a* are connected to the source/drain path of the third transistor 1301*c*, and the associated latch output line 1310*a*. Still further, the gate of the first transistor 1301*a* is connected to a line 1501*a* to which as explained below a "set" signal may be applied, and the gate of the third transistor 1301*c* is connected to a line 1601*a* to which as explained below a "reset" signal may be applied.

As indicated in FIG. 2, the (set signal) line 1501*a* is connected to the gates of respective first transistors 1301*a* of all n latches 1300, and the (reset signal) line 1601*a* is connected to the gates of respective third transistors 1301*c* of all n latches 1300.

For example, at the beginning of a respective cycle, e.g., an erase or programming (or a read) cycle, the reset signal line 1601*a* may be activated, i.e., a respective reset signal may be applied to the line 1601*a*, i.e., to the gates of all n third transistors 1301*c* of the n latches 1300.

Hence, the outputs (OUT) of all n latches 1300, i.e., all n latch output lines 1310*a*, 1310*b*, 1310*c*, 1310*d* are in a low state, i.e., all n word lines 1010*a* are deactivated, i.e. in a non-selected state.

If then a column address is input via a respective line or lines 1400 to the word line decoder 1100, the word line decoder 1100 identifies the respective word line 1010*a* associated with the respective column address. If for example word line 1010*a* is identified, then a word line selection signal is applied at the respective latch input line 1311*a* associated with the word line 1010*a*. To the residual latch input lines 1311*b*, 13111*c*, 1311*d*, etc., no word line selection signals are applied.

Thereafter, the set signal line 1501*a* is activated, i.e., a respective set signal is applied to the line 1501*a*, i.e., to the gates of all n first transistors 1301*a* of the n latches 1300.

Consequently, the latch output line 1310*a*, i.e., the output (OUT) of the latch 1300*a* associated with the identified word line 1010*a* changes to a high state, whereas the residual latch output lines 1310*b*, 1310*c*, 1310*d*, etc./the outputs of the residual latches remain in a low state.

The above column address, and/or set signal, and/or reset signal, etc. e.g., may be driven or controlled by a sector driver control having a programmable sector memory for storing the word lines or associated addresses of word lines to be selected or simultaneously selected during a cycle.

If in addition to the above word line 1010*a*, a further word line is to be simultaneously selected—in accordance to the programming of the sector memory—, the respective column address associated with the further word line to be additionally simultaneously selected is input via the above line or lines 1400 to the word line decoder 1100. Thereafter, again, the word line decoder 1100 identifies the respective (further) word line associated with the respective column address, and applies a word line selection signal at the respective latch input line (e.g., the latch input line 1311*d*) associated with the further word line. To the residual latch input lines 1311*a*, 1311*b*, 1311*c*, etc., no word line selection signals are applied.

Thereafter, again, the set signal line 1501*a* is activated, i.e., a respective set signal is applied to the line 1501*a*, i.e., to the gates of all n first transistors 1301*a* of the n latches 1300.

Consequently, the latch output line (here: e.g., the latch output line 1310*d*)/the output (OUT) of the latch associated with the identified further word line changes to a high state.

Further, the latch connected to the latch input line to which previously—as explained above—a word line selection signal was applied (here: the latch 1300*a*) remains in the previous state. Hence, the respective latch output line (here: e.g., the latch output line 1310*a*)/the output (OUT) of the respective latch (here: the latch 1300*a*) remains in a high state.

Further, the outputs of the residual latches/the residual latch output lines (here: the latch output lines 1310*b*, 1310*c*, etc.) remain in a low state.

If in addition to the above two word lines a still further (third) word line is to be simultaneously selected—as defined by the programming of the sector memory—, the respective column address associated with the respective third word line to be simultaneously selected is input via the above line or lines 1400 to the word line decoder 1100. Thereafter, again, the word line decoder 1100 identifies the respective still further (third) word line associated with the respective column address, and applies a word line selection signal at the respective latch input line (e.g., the latch input line 1311*c*) associated with the third word line. To the residual latch input lines 1311*a*, 1311*b*, 1311*d*, etc., no word line selection signals are applied.

Thereafter, again, the set signal line 1501*a* is activated, i.e., a respective set signal is applied to the line 1501*a*, i.e., to the gates of all n first transistors 1301*a* of the n latches 1300.

Consequently, the latch output line (here: e.g., the latch output line 1310*c*)/the output (OUT) of the latch associated with the identified third word line changes to a high state.

Further, the two latches 1300*a* connected to the latch input lines to which previously—as explained above—respective word line selection signals had been applied remain in the previous state. Hence, the respective latch output lines (here: e.g., the latch output lines 1310*a* and 1310*d*)/the output (OUT) of the respective latches remain in a high state.

Further, the outputs of the residual latches/the residual latch output lines (here: the latch output lines 1310*b*, etc.) remain in a low state.

If it is detected that no further word line is to be additionally simultaneously selected, all n high voltage switches 1080*a* are brought from a non-conducting to a conducting state (e.g., be activating respective signals provided on a pair of transmission gate control lines 1701*a*, 1701*b*, connected with respective gates of the above first and second transistors of the high voltage switch transmission gates, as illustrated in FIG. 2).

In response, the high voltage switches 1080*a* forward the output voltages provided by the n latches 1300 on the above latch output lines 1310*a*, 1310*b*, 1310*c*, 1310*d*. The above high voltage supply devices/high voltage latches 1020*a* amplify the respective voltages to the output level. Since as explained above in the present example, e.g., only the above latch output lines 1310*a*, 1310*c*, 1310*d* are in a high state, and the remaining latch output lines, e.g., the latch output line 1310*b*, etc. are in a low state, the voltage on the above word line 1010*a* (associated with the latch output line 1310*a*), the above further word line (associated with the latch output line 1310*d*), and the above still further (third) word line (associated with the latch output line 1310*c*) becomes high, whereas the voltage on the remaining word lines remains low.

Hence, the above word line 1010a, the above further word line, and the above still further (third) word line are brought into a selected state, whilst the remaining word lines remain deactivated, i.e. in a non-selected state.

Summarized, a freely selectable subset of word lines/a freely selectable combination of word lines might simultaneously be selected (in accordance to the freely changeable programming of the above sector memory).

If appropriate, e.g., at the end of a respective cycle, again, the above reset signal line 1601a may be activated, i.e., a respective reset signal may be applied to the line 1601a, i.e., to the gates of all n third transistors 1301c of the n latches 1300. Hence, again, the outputs (OUT) of all n latches 1300, i.e., all n latch output lines 1310a, 1310b, 1310c, 1310d are brought back into a low state, i.e., all n word lines are again deactivated, i.e. in a non-selected state.

The above procedure which as the e.g., allows a freely selectable combination of word lines to be simultaneously selected for instance might be used for the following purpose: In a first process, all EEPROM transistor cells of the semiconductor memory device or of a certain sector of the semiconductor memory device (having cells associated with several different word lines) may be programmed or erased, e.g., by applying respective program/erase pulses to the respective cells. Then, the content of the cells may be read out, and the respective cell read out currents may be compared with desired target cell currents.

Then, in a second process, only those word lines may be selected according to the procedure described above (e.g., by suitably programming or re-programming the above sector memory) which are associated with cells for which the difference between the cell read out currents and the desired target cell currents is still too big.

Then, only for the cells associated with the selected word lines, a further programming/erasing is performed, e.g., by applying respective additional program/erase pulses to the respective cells. Then, the content of the cells may again be read out, and the respective cell read out currents may again be compared with the desired target cell currents, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    a plurality of sectors; and
    a sector driver for simultaneously driving word lines corresponding to a single sector, the sector driver being connected to each word line, the sector driver comprising a programmable sector memory for storing the sectors and word lines corresponding to each sector; a plurality of memory elements, each memory element having a data input and a data output; and
    a plurality of or-gates having an output and two inputs, the output of each or-gate being connected to a word line, the inputs of each or-gate being connected to one memory element and the word line decoder.

2. The integrated circuit according to claim 1, comprising where the plurality of memory elements include one or more latches.

3. An integrated circuit comprising:
    a plurality of sectors; and
    a sector driver for simultaneously driving word lines corresponding to a single sector, the sector driver being connected to each word line, the sector driver comprising a programmable sector memory for storing the sectors and word lines corresponding to each sector; and a plurality of memory elements, each memory element having a data input and a data output; and wherein the plurality of memory elements constitute a shift register, the data output of each memory element being connected to the data input of each consecutive memory element, each memory element having a control input for shifting the data input to the data output.

4. The integrated circuit according to claim 1, comprising:
    a plurality of level shifters for shifting an input voltage to a higher output voltage, wherein a level shifter is provided for each word line.

5. The integrated circuit according to claim 4, wherein the level shifters each comprise two inverters connected in series.

6. An integrated circuit comprising:
    a plurality of sectors; and
    a sector driver for simultaneously driving word lines corresponding to a single sector, the sector driver being connected to each word line, the sector driver comprising a programmable sector memory for storing the sectors and word lines corresponding to each sector; a plurality of memory elements, each memory element having a data input and a data output;
    a plurality of level shifters for shifting an input voltage to a higher output voltage, wherein a level shifter is provided for each word line; and
    a plurality of high voltage switches, each high voltage switch connecting one of the level shifters to the output of one of the or-gates.

7. A semiconductor memory device, comprising:
    a plurality of memory cells, each memory cell comprising a control gate, a source and a drain, the memory cells being arranged in rows and columns;
    a plurality of word lines, each of the word lines being connected to the control gates of the memory cells arranged in one row;
    a plurality of sectors, each sector comprising a plurality of the memory cells; a word line decoder, the word line decoder being adapted to decode a row address of a particular memory cell and drive the corresponding word line connected to the addressed memory cell; and
    a sector driver for simultaneously driving the word lines corresponding to a single sector, the sector driver being connected to each word line and comprising a programmable sector memory for storing the sectors and word lines corresponding to each sector and;
    a plurality of or-gates having an output and two inputs, the output of each or-gate being connected to a word line, the inputs of each or-gate being connected to one memory element and the word line decoder.

8. The semiconductor memory device according to claim 7, comprising wherein the memory cells are non-volatile memory cells such as EEPROM cells, PROM cells or ROM cells.

9. The semiconductor memory device according to claim 7, comprising wherein the memory device is a flash memory.

10. The semiconductor memory device according to claim 7, wherein the sector driver comprises:
    a plurality of memory elements, such as a plurality of latches, each memory element having a data input and a data output, the data output of each memory element being connected to one word line.

11. The semiconductor memory device according to claim 10, comprising wherein the memory elements of the sector driver are EEPROM cells, PROM cells, ROM cells or SRAM cells.

12. The semiconductor memory device according to claim 10, comprising wherein the plurality of memory elements constitute a shift register, the data output of each memory element being connected to the data input of each consecutive memory element, each memory element having a control input for shifting the data input to the data output.

13. The semiconductor memory device according to claim 10, wherein each memory element comprises a reset input for resetting the data output of each memory element.

14. The semiconductor memory device according to claim 10, comprising:
   a plurality of level shifters for shifting an input voltage to a higher output voltage, wherein a level shifter is provided for each word line.

15. The semiconductor memory device according to claim 14, comprising:
   a plurality of high voltage switches, each high voltage switch connecting one of the level shifters to the output of one of the or-gates.

16. The semiconductor memory device according to claim 7, wherein the level shifters each comprise two inverter connected in series to each other.

* * * * *

UNITED STATES PATENT AND TRADEMARK OFFICE
CERTIFICATE OF CORRECTION

PATENT NO. : 7,773,450 B2  Page 1 of 1
APPLICATION NO. : 11/674917
DATED : August 10, 2010
INVENTOR(S) : Massimo Atti et al.

It is certified that error appears in the above-identified patent and that said Letters Patent is hereby corrected as shown below:

Title Page, Inventors, item (75) delete "Michele Boraretto" and insert in place thereof --Michele Boaretto--.

Signed and Sealed this

Thirtieth Day of November, 2010

David J. Kappos
*Director of the United States Patent and Trademark Office*